(12) United States Patent
Wu et al.

(10) Patent No.: US 12,087,637 B2
(45) Date of Patent: Sep. 10, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chung-Chiang Wu, Taichung (TW); Hsin-Han Tsai, Hsinchu (TW); Wei-Chin Lee, Taipei (TW); Chia-Ching Lee, New Taipei (TW); Hung-Chin Chung, Pingzhen (TW); Cheng-Lung Hung, Hsinchu (TW); Da-Yuan Lee, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/120,499

(22) Filed: Dec. 14, 2020

(65) Prior Publication Data
US 2021/0098301 A1  Apr. 1, 2021

Related U.S. Application Data

(62) Division of application No. 16/193,906, filed on Nov. 16, 2018, now Pat. No. 10,867,864.
(Continued)

(51) Int. Cl.
*H01L 21/8234* (2006.01)
*H01L 21/027* (2006.01)
(Continued)

(52) U.S. Cl.
CPC .. *H01L 21/82345* (2013.01); *H01L 21/28079* (2013.01); *H01L 21/28088* (2013.01); *H01L 21/32133* (2013.01); *H01L 21/823462* (2013.01); *H01L 21/823468* (2013.01); *H01L 21/823842* (2013.01); *H01L 21/823857* (2013.01); *H01L 21/823864* (2013.01);
(Continued)

(58) Field of Classification Search
CPC ............ H01L 27/1116; H01L 27/0886; H01L 21/32139; H01L 29/517; H01L 29/42364; H01L 29/66545; H01L 27/0922
See application file for complete search history.

(56) References Cited

U.S. PATENT DOCUMENTS 8,129,794 B2  3/2012 Hirase
8,487,378 B2  7/2013 Goto et al.
(Continued)

FOREIGN PATENT DOCUMENTS

CN  107369650 A  11/2017
KR  20140142957 A  12/2014
(Continued)

*Primary Examiner* — Brian Turner
(74) *Attorney, Agent, or Firm* — Slater Matsil, LLP

(57) ABSTRACT

Semiconductor devices and methods of manufacturing semiconductor devices with differing threshold voltages are provided. In embodiments the threshold voltages of individual semiconductor devices are tuned through the removal and placement of differing materials within each of the individual gate stacks within a replacement gate process, whereby the removal and placement helps keep the overall process window for a fill material large enough to allow for a complete fill.

20 Claims, 9 Drawing Sheets

Related U.S. Application Data

(60) Provisional application No. 62/737,419, filed on Sep. 27, 2018.

(51) Int. Cl.
| | |
|---|---|
| *H01L 21/28* | (2006.01) |
| *H01L 21/285* | (2006.01) |
| *H01L 21/3213* | (2006.01) |
| *H01L 21/8238* | (2006.01) |
| *H01L 27/088* | (2006.01) |
| *H01L 27/092* | (2006.01) |
| *H01L 29/40* | (2006.01) |
| *H01L 29/423* | (2006.01) |
| *H01L 29/49* | (2006.01) |
| *H01L 29/66* | (2006.01) |

(52) U.S. Cl.
CPC ...... *H01L 27/0886* (2013.01); *H01L 27/0922* (2013.01); *H01L 27/0924* (2013.01); *H01L 29/401* (2013.01); *H01L 29/4958* (2013.01); *H01L 29/4966* (2013.01); *H01L 29/66545* (2013.01); *H01L 21/0273* (2013.01); *H01L 21/28556* (2013.01); *H01L 21/823431* (2013.01); *H01L 21/823821* (2013.01); *H01L 29/42372* (2013.01)

(56) References Cited

U.S. PATENT DOCUMENTS

| | | | |
|---|---|---|---|
| 8,729,634 | B2 | 5/2014 | Shen et al. |
| 8,826,213 | B1 | 9/2014 | Ho et al. |
| 8,887,106 | B2 | 11/2014 | Ho et al. |
| 9,219,155 | B2 | 12/2015 | Steigerwald et al. |
| 9,524,967 | B1 | 12/2016 | Liu et al. |
| 9,685,520 | B1 | 6/2017 | Hsu et al. |
| 9,947,540 | B2 | 4/2018 | Tsai et al. |
| 2007/0128775 | A1 | 6/2007 | Jeon et al. |
| 2007/0158702 | A1 | 7/2007 | Doczy et al. |
| 2012/0153275 | A1 | 6/2012 | Endo et al. |
| 2014/0282326 | A1 | 9/2014 | Chen et al. |
| 2014/0363960 | A1 | 12/2014 | Kim et al. |
| 2015/0021699 | A1 | 1/2015 | Ando et al. |
| 2015/0126023 | A1 | 5/2015 | Choi et al. |
| 2015/0171177 | A1 | 6/2015 | Cheng et al. |
| 2015/0187939 | A1* | 7/2015 | Wu .................. H01L 29/42376 257/412 |
| 2015/0214112 | A1* | 7/2015 | Zhao ................ H01L 21/8238 257/369 |
| 2015/0243658 | A1 | 8/2015 | Joshi et al. |
| 2015/0263004 | A1* | 9/2015 | Cheon .................. H01L 29/78 257/392 |
| 2015/0287645 | A1 | 10/2015 | Zhao et al. |
| 2015/0357244 | A1* | 12/2015 | Ragnarsson ...... H01L 21/28088 438/275 |
| 2016/0027664 | A1 | 1/2016 | Ando et al. |
| 2016/0126139 | A1* | 5/2016 | Yang ................ H01L 21/02186 257/407 |
| 2016/0268259 | A1 | 9/2016 | Chang et al. |
| 2016/0276224 | A1* | 9/2016 | Gan .................. H01L 27/0924 |
| 2016/0351569 | A1 | 12/2016 | Song et al. |
| 2017/0062282 | A1 | 3/2017 | Lin et al. |
| 2017/0069634 | A1 | 3/2017 | Kim |
| 2017/0076995 | A1 | 3/2017 | Chang et al. |
| 2017/0125408 | A1* | 5/2017 | Park ..................... H01L 29/435 |
| 2017/0133372 | A1* | 5/2017 | Bao ..................... H01L 29/401 |
| 2017/0133489 | A1 | 5/2017 | Zhou |
| 2017/0213826 | A1 | 7/2017 | Kim et al. |
| 2017/0229461 | A1 | 8/2017 | Liao et al. |
| 2017/0352668 | A1* | 12/2017 | Li ......................... H10B 10/12 |
| 2018/0211875 | A1* | 7/2018 | Basker .............. H01L 29/66795 |
| 2019/0326324 | A1* | 10/2019 | Lee ................... H01L 21/76251 |

FOREIGN PATENT DOCUMENTS

| | | |
|---|---|---|
| KR | 20160098186 A | 8/2016 |
| KR | 20160139814 A | 12/2016 |
| KR | 20170015055 A | 2/2017 |

\* cited by examiner

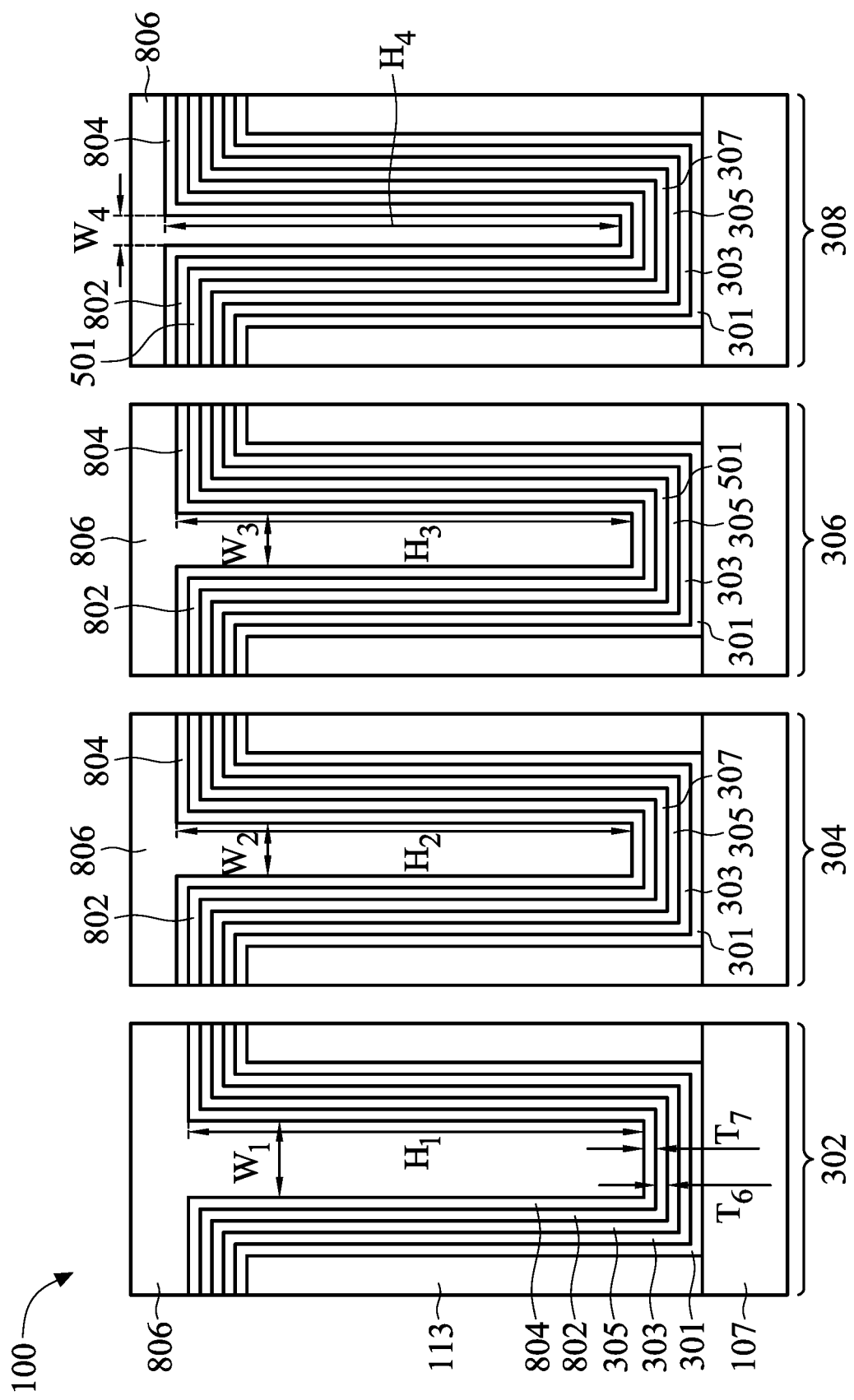

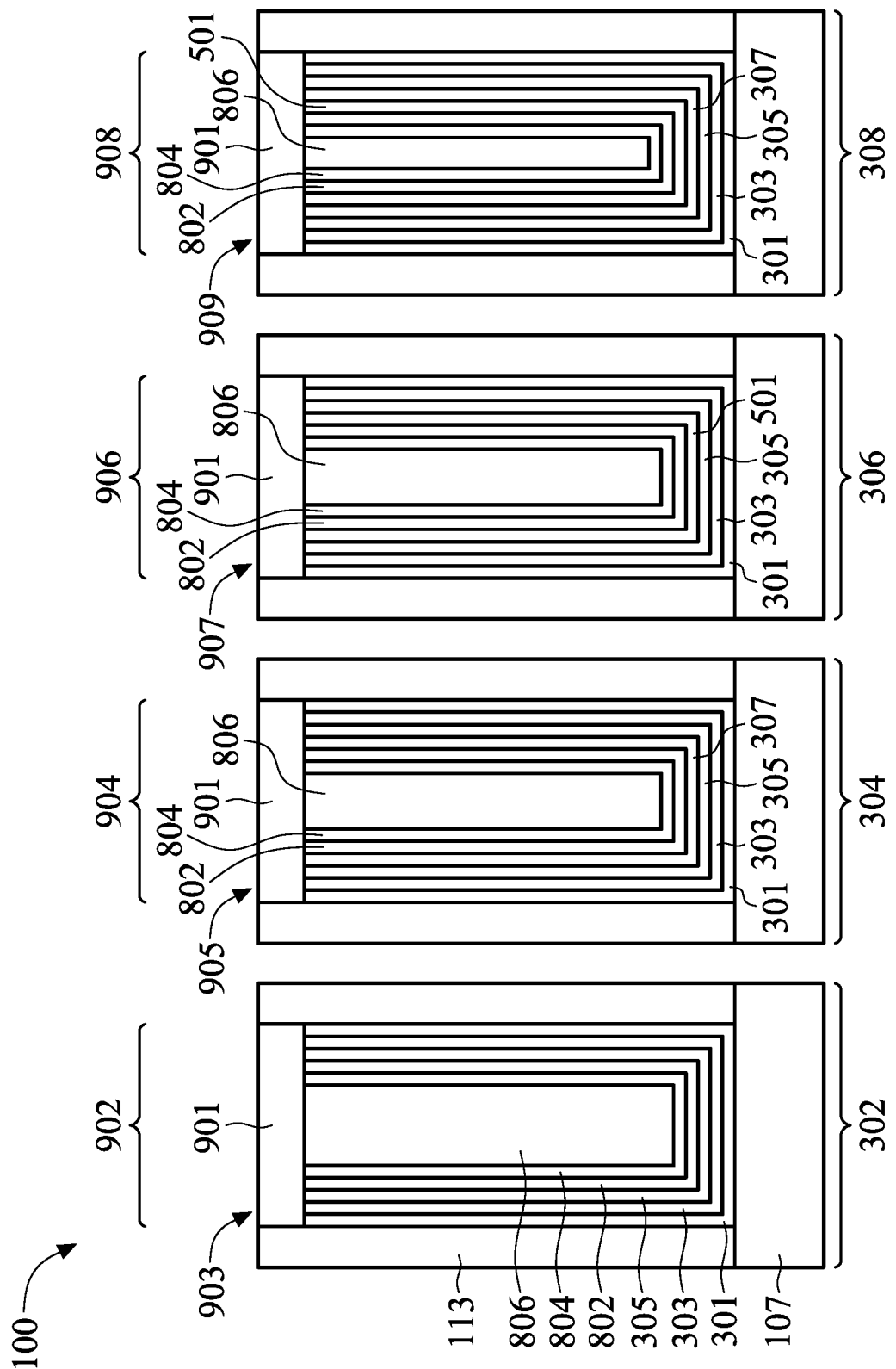

SEMICONDUCTOR DEVICE AND METHOD OF MANUFACTURE

PRIORITY CLAIM AND CROSS-REFERENCE

This application is a division of U.S. patent application Ser. No. 16/193,906, filed on Nov. 16, 2018, entitled "Semiconductor Device and Method of Manufacture," which claims the benefit of U.S. Provisional Application No. 62/737,419, filed on Sep. 27, 2018, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 illustrates a deposition of a fill material, in accordance with some embodiments.

FIG. 9 illustrates a formation of a cap, in accordance with some embodiments.

DETAILED DESCRIPTION

Figure 1:
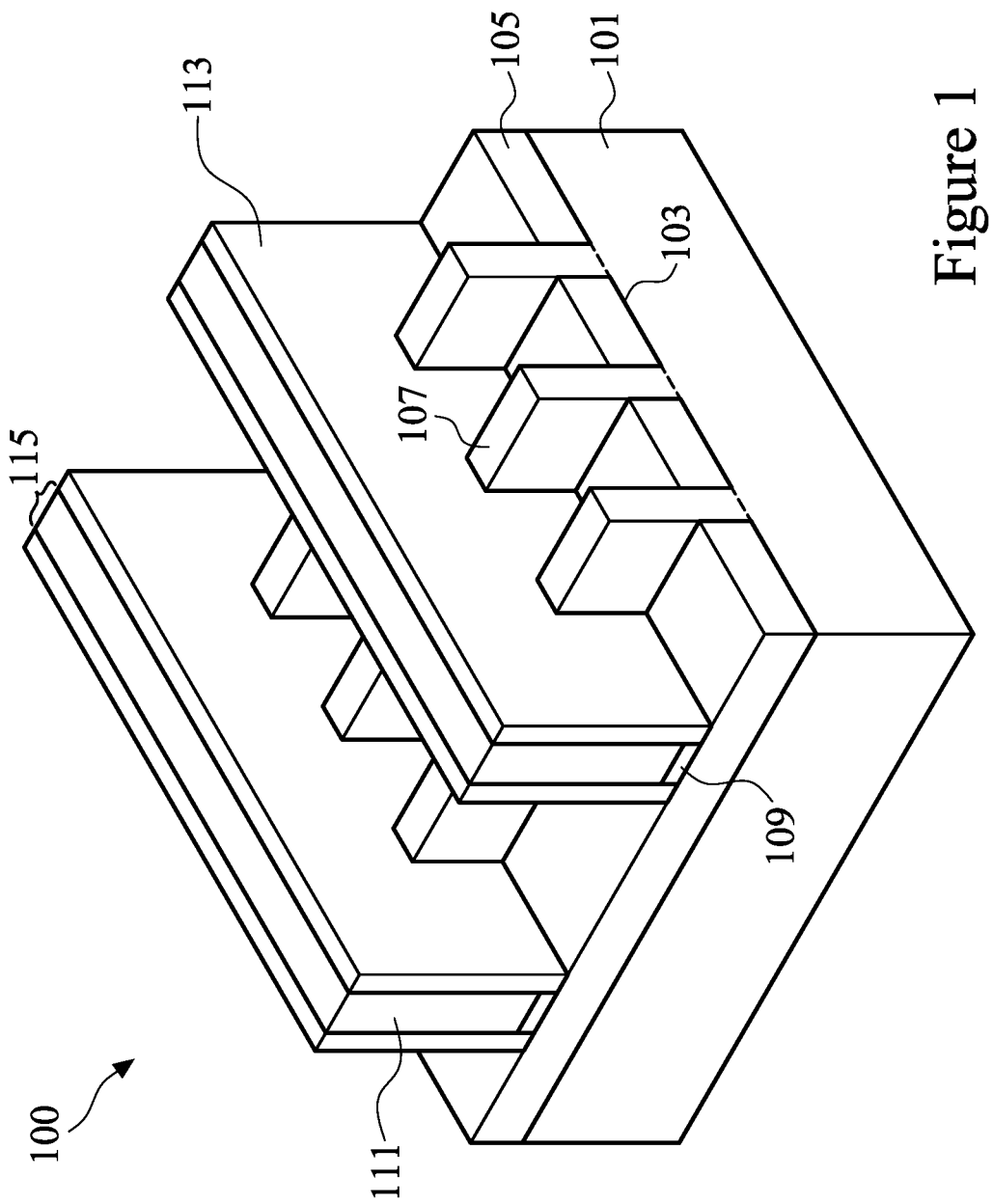
FIG. 1 illustrates a perspective view of a formation of semiconductor fins, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including finFET devices with multiple threshold voltages for 5 nm or 3 nm technology nodes. However, embodiments are not limited to the examples provided herein, and the ideas may be implemented in a wide array of embodiments.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the dummy gate dielectric 109 thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive or non-conductive material and may be selected from a group comprising polysilicon, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, or the like and may be formed by methods utilized to form such a layer, such as chemical vapor deposition (CVD), plasma enhanced CVD, sputter, or other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
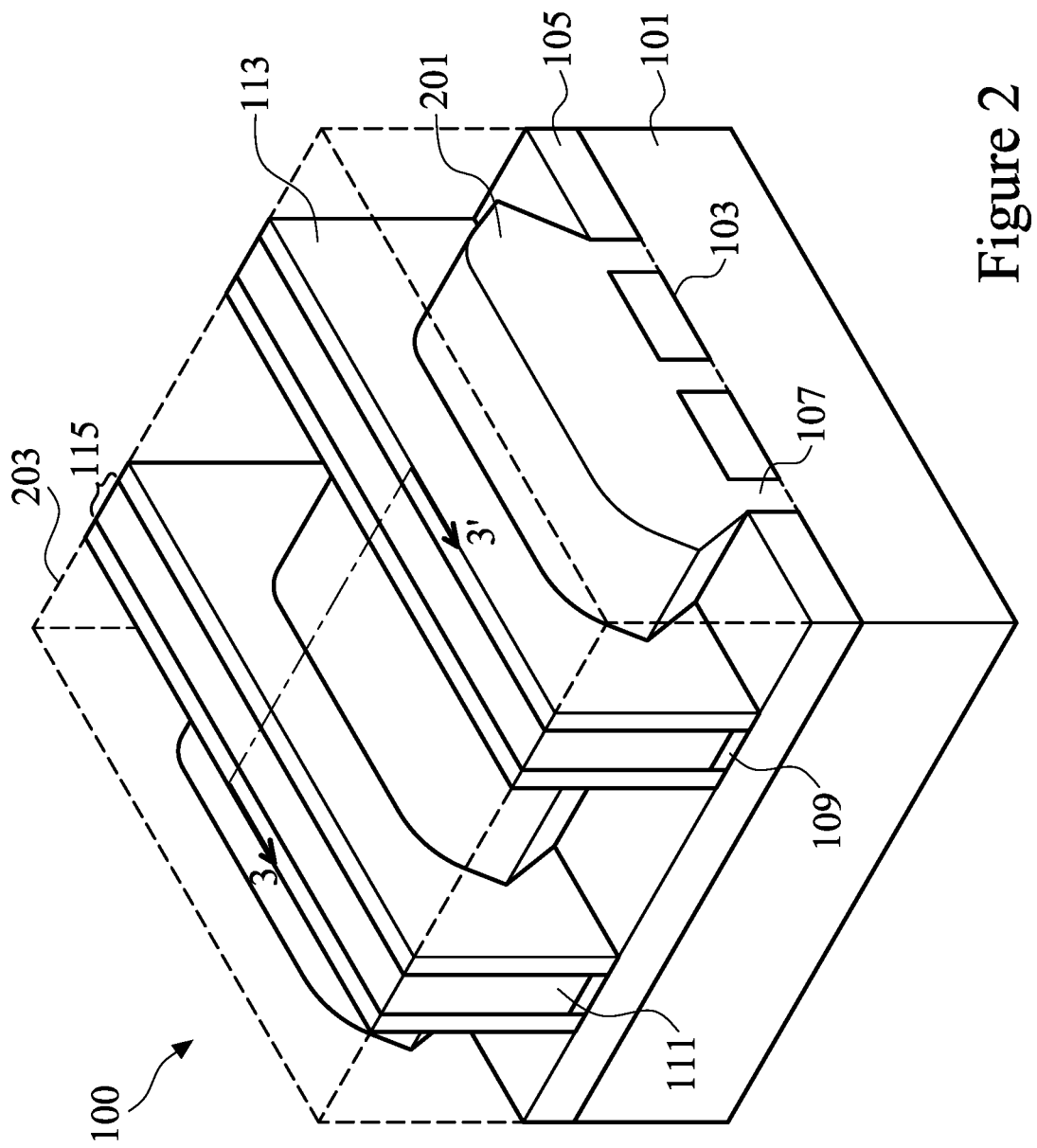
FIG. 2 illustrates formation of source/drain regions, in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, or the like, and may continue for between about 5 minutes and about 120 minutes, such as about 30 minutes.

In an embodiment the source/drain regions 201 may be formed to have a thickness of between about 5 Å and about 1000 Å and a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3:
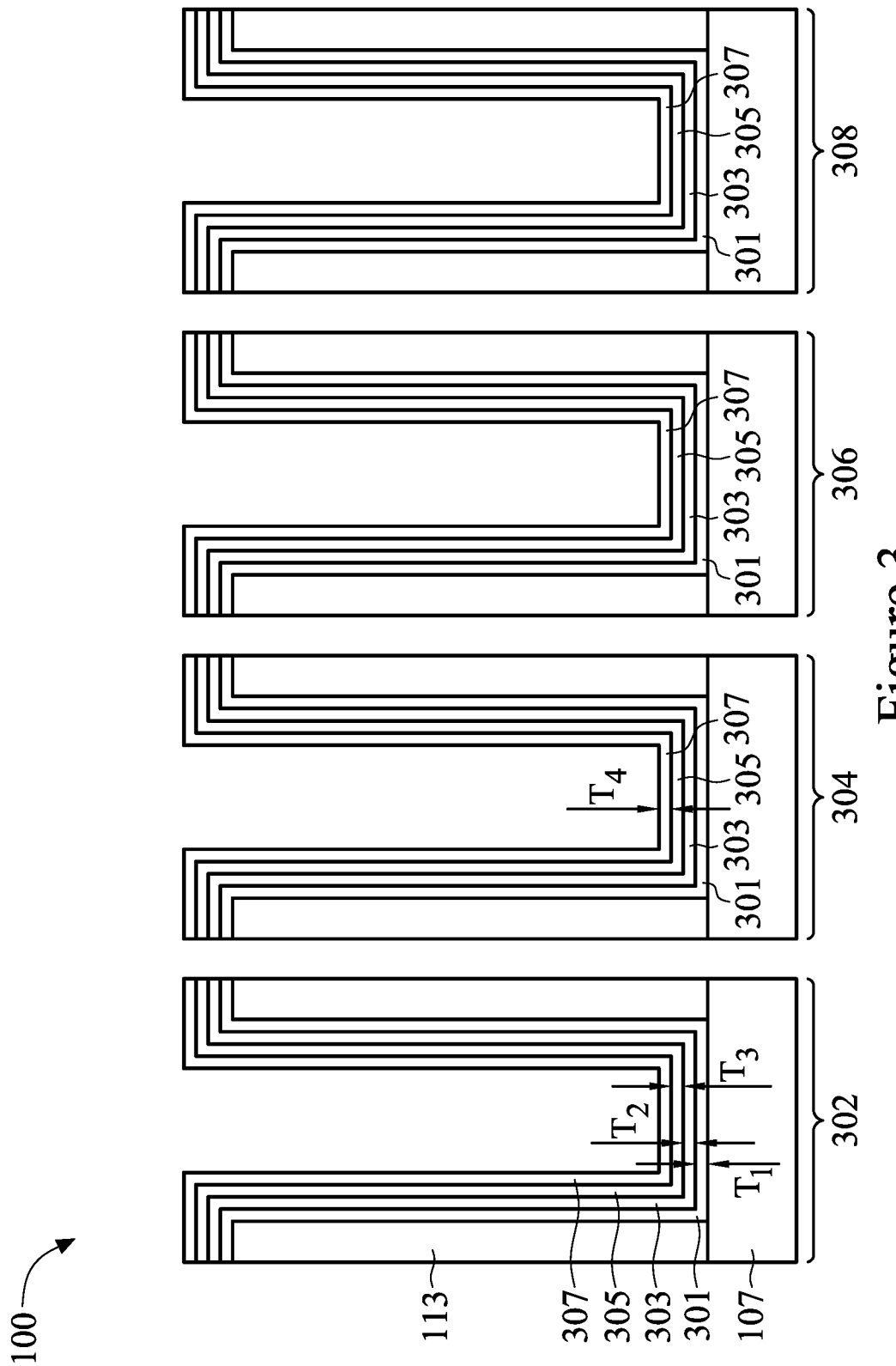
FIG. 3 illustrates formation of materials for a gate stack, in accordance with some embodiments.

FIG. 3 illustrates a cross-sectional view of FIG. 2 along line 3-3' in order to better illustrate a removal and replacement of the material of the dummy gate electrode 111 and the dummy gate dielectric 109 with a plurality of layers for a first gate stack 902 (not illustrated in FIG. 3 but illustrated and described below with respect to FIG. 9). Additionally in FIG. 3, while the first gate stack 902 is illustrated as being within a first region 302 of the substrate 101, there is also illustrated a second region 304 (for a second gate stack 904) of the substrate 101, a third region 306 (for a third gate stack 906) of the substrate 101, and a fourth region 308 (for a fourth gate stack 908) of the substrate 101. In an embodiment the first gate stack 902 may be a gate stack for a first transistor 903 (e.g., a first NMOS finFET transistor) with a first threshold voltage Vt1 while the second gate stack 904 may be for a second transistor 905 (e.g., a second NMOS finFET transistor) with a second threshold voltage Vt2 different from the first threshold voltage Vt1. Additionally, the third gate stack 906 may be for a third transistor 907 (e.g., a first PMOS finFET transistor) with a third threshold voltage Vt3 while the fourth gate stack 908 may be for a fourth transistor 909 (e.g., a second PMOS finFET transistor) with a fourth threshold voltage Vt4 different from the third threshold voltage Vt3. However, any suitable devices may be utilized.

In an embodiment the dummy gate electrode 111 and the dummy gate dielectric 109 may be removed using, e.g., one or more wet or dry etching processes that utilize etchants that are selective to the material of the dummy gate electrode 111 and the dummy gate dielectric 109. However, any suitable removal process or processes may be utilized.

Once the dummy gate electrode 111 and the dummy gate dielectric 109 have been removed, a process to form the first gate stack 902, the second gate stack 904, the third gate stack 906, and the fourth gate stack 908 may be begun by depositing a series of layers. In an embodiment the series of layers may include an interfacial layer 301, a first dielectric material 303, a first metal material 305, and a first p-metal work function layer 307.

Optionally, the interfacial layer 301 may be formed prior to the formation of the first dielectric material 303. In an embodiment the interfacial layer 301 may be a material such as silicon dioxide formed through a process such as in situ steam generation (ISSG). In another embodiment the interfacial layer 301 may be a high-k material such as $HfO_2$, HfSiO, HfSiON, HfTaO, HfTiO, HfZrO, LaO, ZrO, $Ta_2O_5$, combinations of these, or the like, with a first thickness $T_1$ of between about 5 Å and about 20 Å, such as about 10 Å. However, any suitable material or process of formation may be utilized.

Once the interfacial layer 301 is formed, the first dielectric material 303 may be formed as a capping layer over the interfacial layer 301. In an embodiment the first dielectric material 303 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 303 may be deposited to a second thickness $T_2$ of between about 5 Å and about 200 Å, although any suitable material and thickness may be utilized.

The first metal material 305 may be formed adjacent to the first dielectric material 303 as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 305 may be deposited using a deposition process such as atomic layer deposition, chemical vapor deposition, sputtering, or the like, to a third thickness $T_3$ of between about 5 Å and about 200 Å, although any suitable deposition process or thickness may be used.

The first p-metal work function layer 307 may be formed adjacent to the first metal material 305 and, in a particular embodiment, may be similar to the first metal material 305. For example, the first p-metal work function layer 307 may be formed from a metallic material such as TiN, Ti, TiAlN, TaC, TaCN, TaSiN, $TaSi_2$, $NiSi_2$, Mn, Zr, $ZrSi_2$, TaN, Ru, Al, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer 307 may be deposited using a deposition process such as atomic layer deposition, chemical vapor deposition, sputtering, or the like, to a fourth thickness $T_4$ of between about 5 Å and about 200 Å, although any suitable deposition process or thickness may be used.

Figure 4:
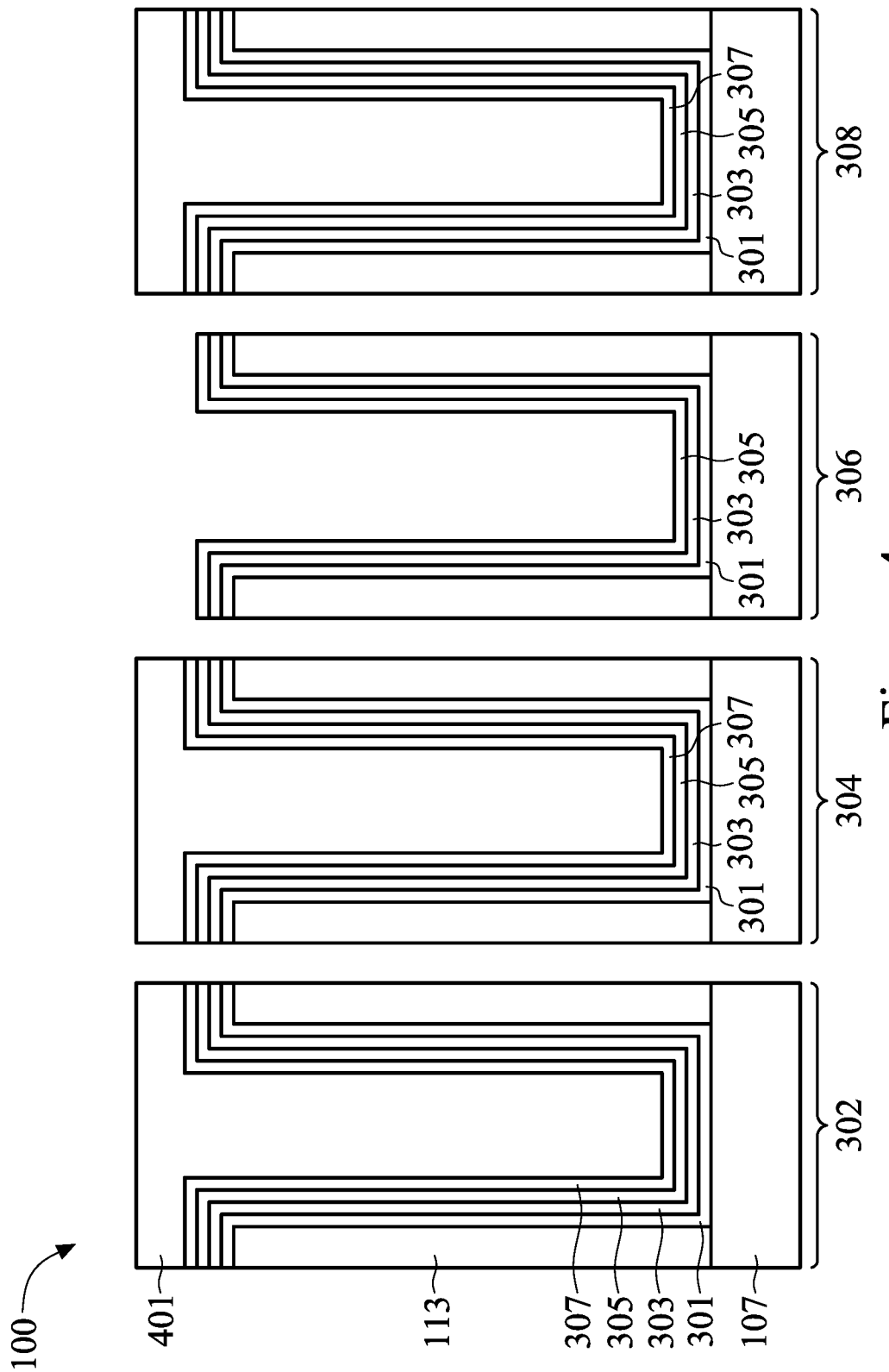
FIG. 4 illustrates a removal process of a first barrier layer, in accordance with some embodiments.

FIG. 4 illustrates a removal of the first p-metal work function layer 307 from the third region 306 but not from the first region 302, the second region 304, and the fourth region 308. In an embodiment the removal may be initiated by placing a first photoresist 401 over the first region 302, the second region 304, the third region 306, and the fourth region 308. Once in place the first photoresist 401 may then be patterned to expose the third region 306 without exposing the first region 302, the second region 304, and the fourth region 308. The patterning may be performed by exposing the first photoresist 401 to a patterned energy source in order to modify the physical properties of the first photoresist 401, and then applying a developer in order to remove that portion of the first photoresist 401 over the third region 306 while leaving the first photoresist 401 to protect the first region 302, the second region 304, and the fourth region 308.

Once the first p-metal work function layer 307 has been exposed in the third region 306, the first p-metal work function layer 307 in the third region 306 may be removed. In an embodiment the first p-metal work function layer 307 may be removed in the third region 306 utilizing one or more etching process, such as a wet etching process or a dry etching process that is selective to the material of the first p-metal work function layer 307 (e.g., titanium nitride) and which stops without significantly removing the material of the underlying first metal material 305 (e.g., tantalum nitride). However, any suitable removal process may be utilized.

Figure 5:
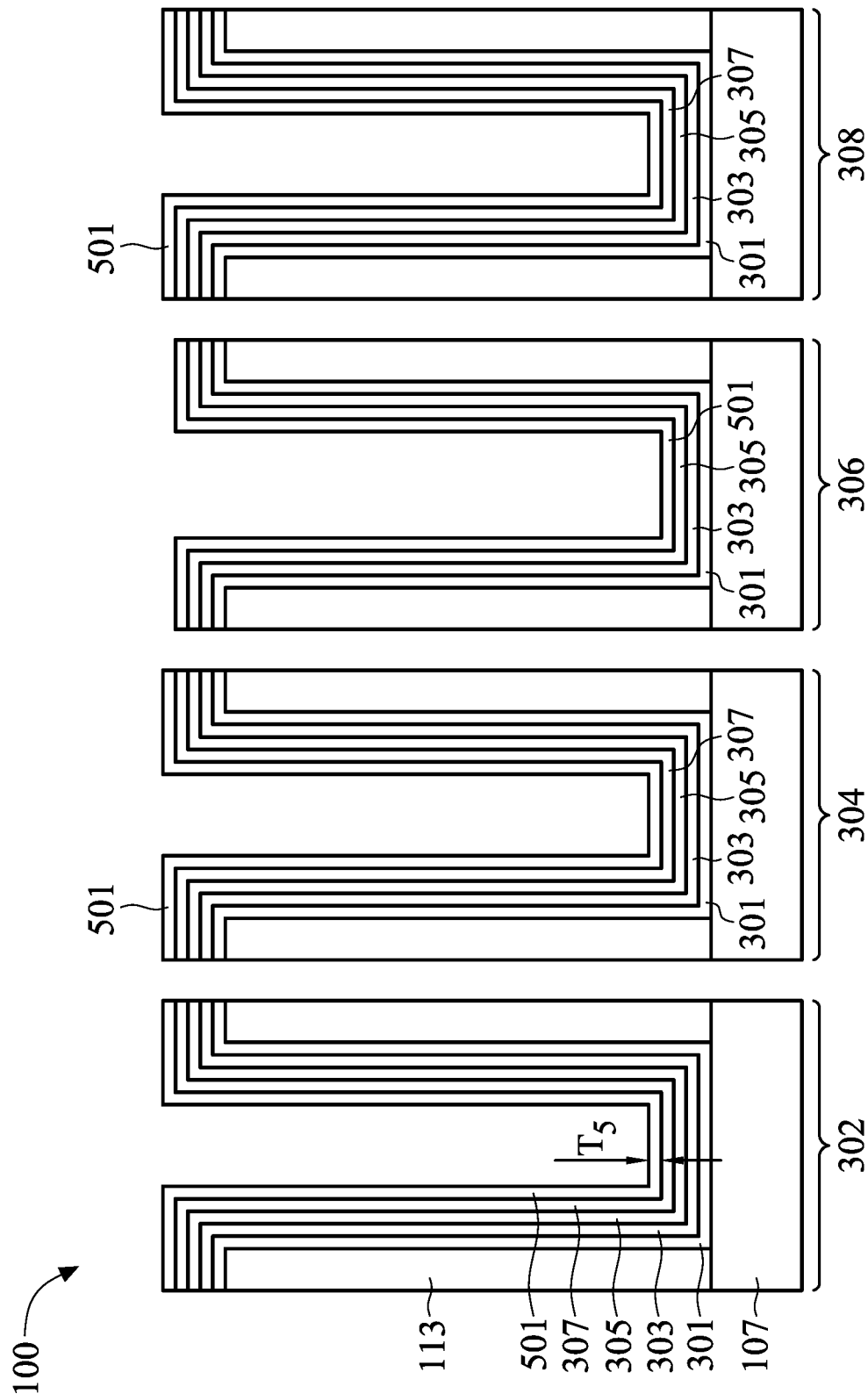
FIG. 5 illustrates a deposition of a second barrier layer, in accordance with some embodiments.

FIG. 5 illustrates that, once the first p-metal work function layer 307 has been removed, the first photoresist 401 may be removed from over the first region 302, the second region 304, and the fourth region 308. In an embodiment the first photoresist 401 may be removed using a process such as ashing, whereby a temperature of the first photoresist 401 is increased until the first photoresist 401 experiences a thermal decomposition and can then be removed. However, any other suitable process may be utilized in order to remove the first photoresist 401.

FIG. 5 additionally illustrates that, once the first photoresist 401 has been removed, a second p-metal work function layer 501 may be deposited over the first region 302, the second region 304, the third region 306, and the fourth region 308. In an embodiment the second p-metal work function layer 501 may be a metal with a work function that is higher than or close to the material of the first p-metal work function layer 307 (e.g., TiN), as well as having a large selectivity to an etching process with the material of the first p-metal work function layer 307. In one embodiment in which the second p-metal work function layer 501 is patterned using a wet etch process with a wet etchant such as $NH_4OH$ or $DIO_3$, and in which the first p-metal work function layer 307 is titanium nitride, the material of the second p-metal work function layer 501 may have a selectivity larger than about 500. However, any suitable selectivity may be utilized.

In particular embodiments, the material of the second p-metal work function layer 501 may be a tungsten based metal like tungsten, tungsten nitride (WNx), tungsten carbide nitride (WCxNy), tungsten oxide (WOx), combinations of these, or the like. In another embodiment the second p-metal work function layer 501 may be a molybdenum based metal such as molybdenum, molybdenum nitride (MoNx), combinations of these, or the like. In yet another embodiment the second p-metal work function layer 501 may be a material such as gold, platinum, palladium, combinations of these, or the like. However, any suitable material may be utilized.

In an embodiment the second p-metal work function layer 501 may be deposited using a deposition process such as atomic layer deposition, chemical vapor deposition, sputtering, or the like. Additionally, the second p-metal work function layer 501 may be deposited to a fifth thickness $T_5$ of between about 5 Å and about 200 Å, although any suitable deposition process or thickness may be used.

Figure 6:
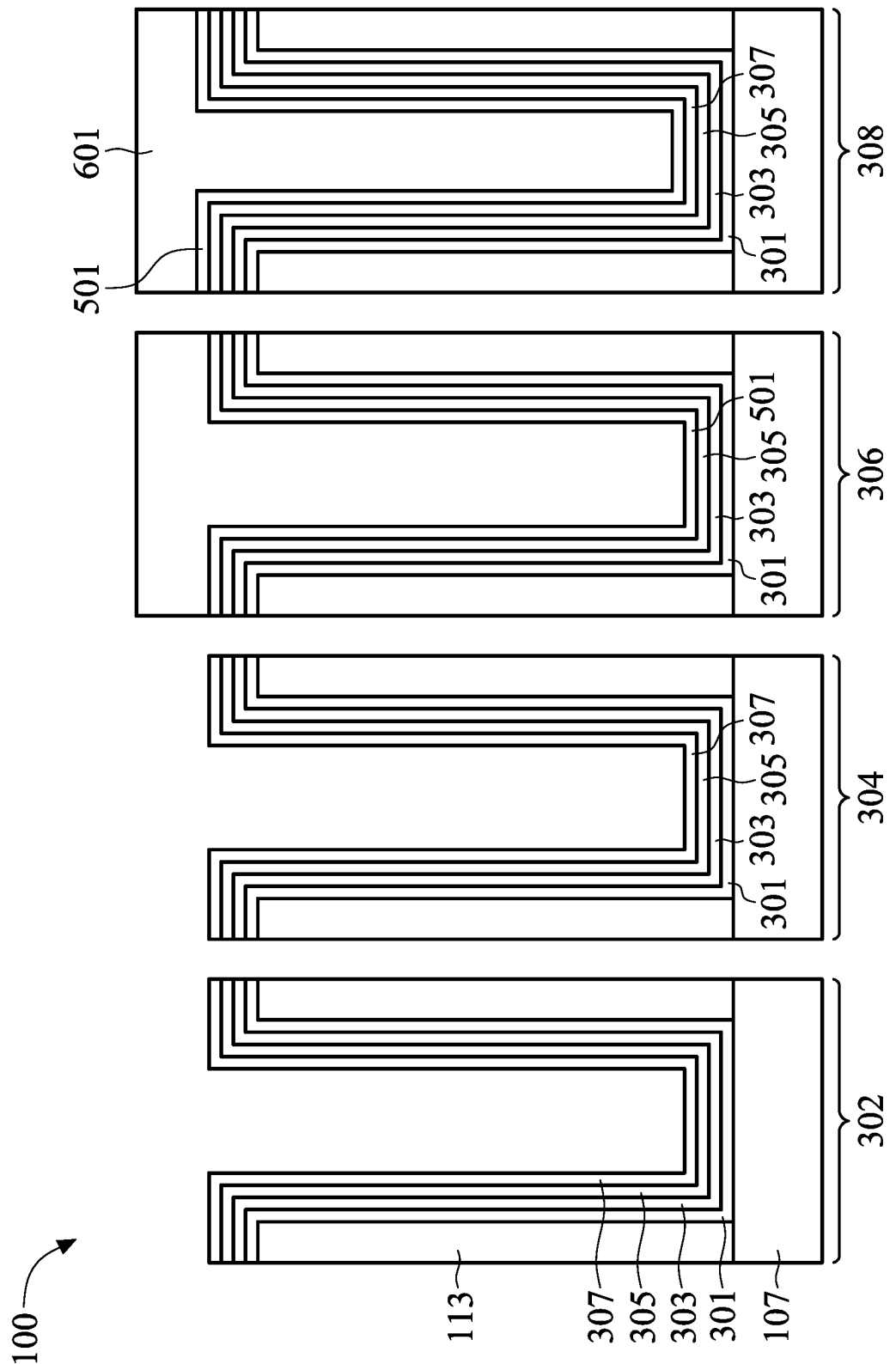
FIG. 6 illustrates a removal process of the second barrier layer, in accordance with some embodiments.

FIG. 6 illustrates that, once the second p-metal work function layer 501 has been deposited over the first region 302, the second region 304, the third region 306, and the fourth region 308, the second p-metal work function layer 501 is removed from the first region 302 and the second region 304. In an embodiment the removal may be initiated by placing a second photoresist 601 over the first region 302, the second region 304, the third region 306, and the fourth region 308. Once in place the second photoresist 601 may then be patterned to expose the first region 302 and the second region 304 without exposing the third region 306 and the fourth region 308. The patterning may be performed by exposing the second photoresist 601 to a patterned energy source in order to modify the physical properties of the second photoresist 601, and then applying a developer in order to remove that portion of the second photoresist 601 over the first region 302 and the second region 304 while leaving the second photoresist 601 to protect the third region 306 and the fourth region 308.

Once the second p-metal work function layer 501 has been exposed in the first region 302 and the second region 304, the second p-metal work function layer 501 in the first region 302 and the second region 304 may be removed. In an embodiment the second p-metal work function layer 501 may be removed in the first region 302 and the second region 304 utilizing one or more etching process, such as a wet etching process or a dry etching process that is selective to the material of the second p-metal work function layer 501 and which stops without significantly removing the material of the underlying first p-metal work function layer 307. However, any suitable removal process may be utilized.

Figure 7:
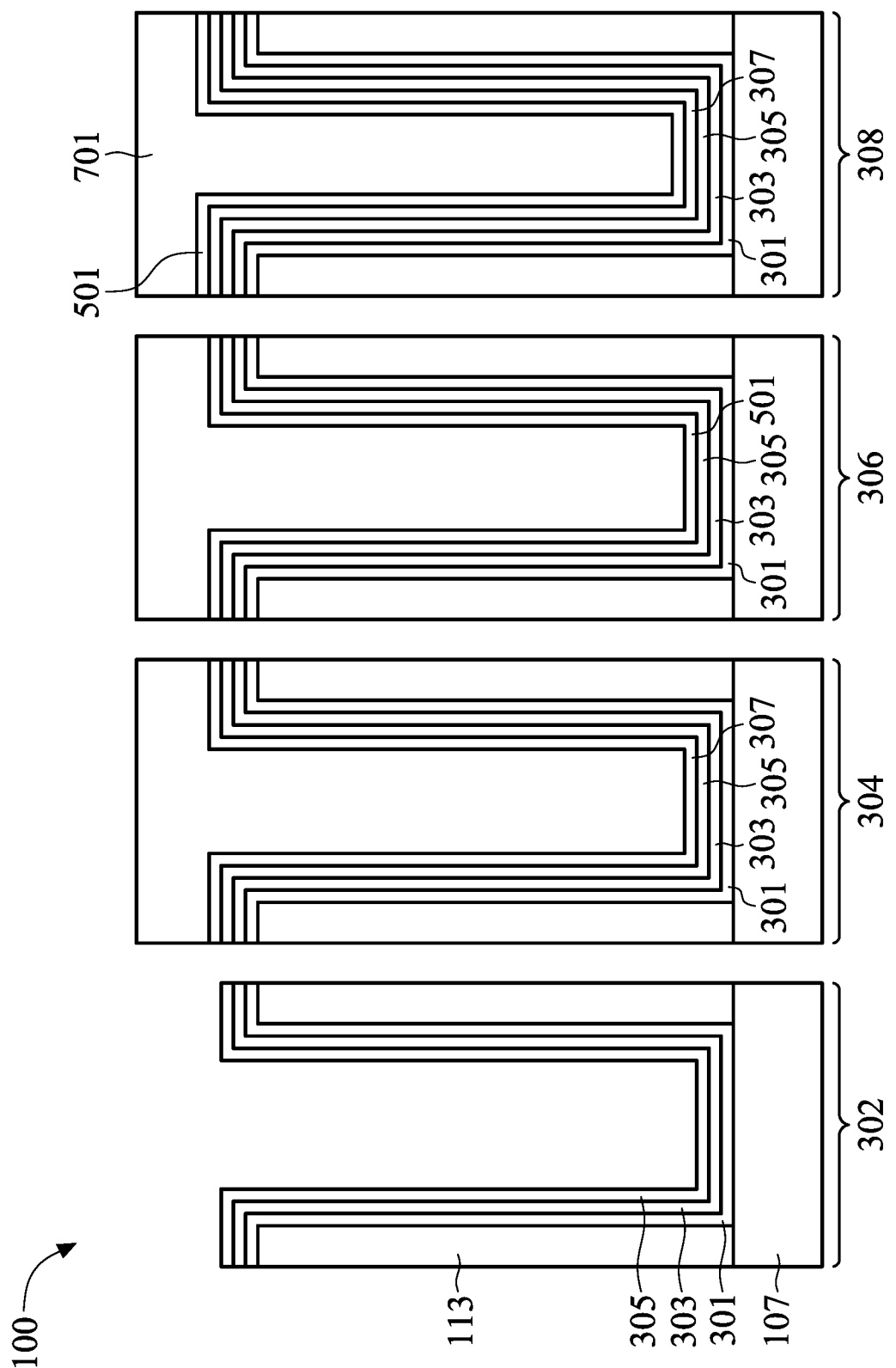
FIG. 7 illustrates another removal process of the first barrier layer, in accordance with some embodiments.

FIG. 7 illustrates that, once the second p-metal work function layer 501 has been removed, the second photoresist 601 may be removed from over the third region 306 and the fourth region 308. In an embodiment the second photoresist 601 may be removed using a process such as ashing, whereby a temperature of the second photoresist 601 is increased until the second photoresist 601 experiences a thermal decomposition and can then be removed. However, any other suitable process may be utilized in order to remove the second photoresist 601.

FIG. 7 additionally illustrates that, once the second photoresist 601 has been removed, the first p-metal work function layer 307 may be removed from the first region 302. In an embodiment the removal may be initiated by placing a third photoresist 701 over the first region 302, the second region 304, the third region 306, and the fourth region 308. Once in place the third photoresist 701 may then be patterned to expose the first region 302 without exposing the second region 304, the third region 306 and the fourth region 308. The patterning may be performed by exposing the third photoresist 701 to a patterned energy source in order to modify the physical properties of the third photoresist 701, and then applying a developer in order to remove that portion of the third photoresist 701 over the first region 302 while leaving the third photoresist 701 to protect the second region 304, the third region 306 and the fourth region 308.

Once the first p-metal work function layer 307 has been exposed in the first region 302, the first p-metal work function layer 307 in the first region 302 may be removed. In an embodiment the first p-metal work function layer 307 may be removed in the first region 302 utilizing one or more etching process, such as a wet etching process or a dry etching process that is selective to the material of the first p-metal work function layer 307 and which stops without significantly removing the material of the underlying first metal material 305. However, any suitable removal process may be utilized.

FIG. 8 illustrates a removal of the third photoresist 701 and a deposition of a first n-metal work function layer 802, a glue layer 804, and a fill material 806. In an embodiment the third photoresist 701 may be removed from over the second region 304, the third region 306 and the fourth region 308 using a process such as ashing, whereby a temperature of the third photoresist 701 is increased until the third photoresist 701 experiences a thermal decomposition and can then be removed. However, any other suitable process may be utilized in order to remove the third photoresist 701.

Once the third photoresist 701 has been removed, the first n-metal work function layer 802 may be deposited. In an embodiment the first n-metal work function layer 802 may be a material such as Ti, Ag, Al, TaAl, TaAlC, TiAlN, TaC, TaCN, TaSiN, Mn, Zr, other suitable n-type work function materials, or combinations thereof. For example, the first n-metal work function layer 802 may be deposited utilizing an atomic layer deposition (ALD) process, CVD process, or the like, to a sixth thickness $T_6$ of between about 20 Å and about 50 Å, such as about 30 Å. However, any suitable materials and processes may be utilized to form the first n-metal work function layer 802.

Once the first n-metal work function layer 802 has been formed, the glue layer 804 may formed in order to help adhere the overlying fill material 806 with the underlying first n-metal work function layer 802 as well as provide a nucleation layer for the formation of the fill material 806. In an embodiment the glue layer 804 may be a material such as titanium nitride or else may be a material similar to the first n-metal work function layer 802 and may be formed using a similar process such as ALD to a seventh thickness $T_7$ of between about 10 Å and about 100 Å, such as about 50 Å. However, any suitable materials and processes may be utilized.

Once the glue layer 804 has been formed, the fill material 806 is deposited to fill a remainder of the opening using the glue layer 804. However, by utilizing the second p-metal work function layer 501 instead of simply depositing additional layers of the first p-metal work function layer 307, fewer layers are utilized in order to obtain the desired tuning of the threshold voltages (further described below), and the widths that will be filled by the subsequently deposited fill material 806 remain larger than otherwise. For example, in the first region 302 the remainder of the opening after deposition of the glue layer 804 may have a first width $W_1$ of between about 10 Å and about 50 Å, such as about 30 Å. Similarly, in the second region 304 the remainder of the opening after deposition of the glue layer 804 may have a second width $W_2$ of between about 10 Å and about 40 Å, such as about 20 Å. In the third region 306 the remainder of the opening after deposition of the glue layer 804 may have a third width $W_3$ of between about 10 Å and about 40 Å, such as about 15 Å. Finally, in the fourth region 308 the remainder of the opening after deposition of the glue layer 804 may have a fourth width $W_4$ of between about 10 Å and about 40 Å, such as about 15 Å.

Additionally, because of the differing number of layers in each of the first region 302, the second region 304, the third region 306, and the fourth region 308, the openings may each have a different height during deposition of the fill material 806. For example, in the first region 302 the remainder of the opening after deposition of the glue layer 804 may have a first height $H_1$ of between about 60 nm and about 100 nm, such as about 80 nm. Similarly, in the second region 304 the remainder of the opening after deposition of the glue layer 804 may have a second height $H_2$ of between about 60 nm and about 100 nm, such as about 80 nm. In the third region 306 the remainder of the opening after deposition of the glue layer 804 may have a third height $H_3$ of between about 60 nm and about 100 nm, such as about 80 nm. Finally, in the fourth region 308 the remainder of the opening after deposition of the glue layer 804 may have a fourth height $H_4$ of between about 60 nm and about 100 nm, such as about 80 nm.

In an embodiment the fill material 806 may be a material such as Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material 806 may be deposited to a thickness of between about 1000 Å and about 2000 Å, such as about 1500 Å. However, any suitable material may be utilized.

However, by utilizing the embodiments described herein, the aspect ratios (e.g., ratio of the height to the width) of each of the openings may be kept small enough to not inhibit the deposition of the fill material 806. In particular, if the aspect ratio is too large, the deposition process of the fill material 806 may result in the formation of voids located within the fill material 806, which would lead to undesirable complications during further manufacturing or operation. However, by utilizing fewer layers in the tuning of the various gate stacks, the aspect ratio can be kept lower, thereby leading to a reduction in the possibility of the formation of voids and their negative results.

FIG. 9 illustrates that, after the fill material 806 has been deposited to fill and overfill the opening, the materials within each of the openings of the first region 302, the second region 304, the third region 306, and the fourth region 308 may be planarized to form the first gate stack 902, the second gate stack 904, the third gate stack 906, and the fourth gate stack 908. In an embodiment the materials may be planarized with the first spacers 113 using, e.g., a chemical mechanical polishing process, although any suitable process, such as grinding or etching, may be utilized.

After the materials of the first gate stack 902, the second gate stack 904, the third gate stack 906, and the fourth gate stack 908 have been formed and planarized, the materials of the first gate stack 902, the second gate stack 904, the third gate stack 906, and the fourth gate stack 908 may be recessed and capped with a capping layer 901. In an embodiment the materials of the first gate stack 902, the second gate stack 904, the third gate stack 906, and the fourth gate stack 908 may be recessed using, e.g., a wet or dry etching process that utilizes etchants selective to the materials of the first gate stack 902, the second gate stack 904, the third gate stack 906, and the fourth gate stack 908. In an embodiment the materials of the first gate stack 902, the second gate stack 904, the third gate stack 906, and the fourth gate stack 908 may be recessed a distance of between about 5 nm and about 150 nm, such as about 120 nm. However, any suitable process and distance may be utilized.

Once the materials of the first gate stack 902, the second gate stack 904, the third gate stack 906, and the fourth gate stack 908 have been recessed, the capping layer 901 may be deposited and planarized with the first spacers 113. In an embodiment the capping layer 901 is a material such as SiN, SiON, SiCON, SiC, SiOC, combinations of these, or the like, deposited using a deposition process such as atomic layer deposition, chemical vapor deposition, sputtering, or the like. The capping layer 901 may be deposited to a thickness of between about 5 Å and about 200 Å, and then planarized using a planarization process such as chemical mechanical polishing such that the capping layer 901 is planar with the first spacers 113.

By utilizing the embodiments described herein, multiple transistors with separately tuned threshold voltages can be achieved without a reduction in the various manufacturing process windows. For example, within the first region 302 a first transistor 903 may be formed with a gate stack which comprises the interfacial layer 301, the first dielectric material 303, the first metal material 305, the first n-metal work function layer 802, the glue layer 804, and the fill material 806. As such, for a first NMOS device, the first transistor 903 may have a first threshold voltage $V_{t1}$ of between about 0.01 V and about 0.15 V, such as about 0.1 V.

Similarly, within the second region 304, a second transistor 905 may be formed with a gate stack which comprises the interfacial layer 301, the first dielectric material 303, the first metal material 305, the first p-metal work function layer 307, the first n-metal work function layer 802, the glue layer 804, and the fill material 806. As such, for a second NMOS device, the second transistor 905 may have a second threshold voltage $V_{t2}$ of between about 0.15 V and about 0.4 V, such as about 0.25 V.

Additionally, within the third region 306, a third transistor 907 may be formed with a gate stack which comprises the interfacial layer 301, the first dielectric material 303, the first metal material 305, the second p-metal work function layer 501, the first n-metal work function layer 802, the glue layer 804, and the fill material 806. As such, for a first PMOS device, the third transistor 907 may have a third threshold voltage $V_{t3}$ of between about 0.15 V and about 0.4 V, such as about 0.25 V.

Finally, within the fourth region 308, a fourth transistor 909 may be formed with a gate stack which comprises the interfacial layer 301, the first dielectric material 303, the first metal material 305, the first p-metal work function layer 307, the second p-metal work function layer 501, the first n-metal work function layer 802, the glue layer 804, and the fill material 806. As such, for a second PMOS device, the fourth transistor 909 may have a fourth threshold voltage $V_{t4}$ of between about 0.01 V and about 0.15 V, such as about 0.1 V.

By utilizing the embodiments described herein, multiple different materials are utilized in order to tune the threshold voltages of the devices. By utilizing multiple different metals, a stacking of multiple layers of the same material (e.g., TiN) may be avoided, and an overall reduction in thickness may be achieved than with the same material by itself. As such, the total thickness of the layers may be reduced, which increases the gap-fill window for lower costs for subsequent layers. Such a reduction further allows for a better threshold stability as fewer voids will be formed and the metal gate can completely fill the openings. As such, multiple threshold voltage tuning can be achieved in a much narrower critical dimension (e.g., for 5 nm and 3 nm technology nodes) without sacrificing the N/P patterning and metal gate gap-fill windows.

In an embodiment a method of manufacturing a semiconductor device includes: depositing a gate dielectric over a first region, a second region, a third region, and a fourth region; depositing a first metal material over the first region, the second region, the third region, and the fourth region; depositing a first work function layer over the first region, the second region, the third region, and the fourth region; removing the first work function layer from the third region;

depositing a second work function layer over the first region, the second region, the third region, and the fourth region after the removing the first work function layer, the second work function layer being different from the first work function layer; removing the second work function layer from the first region and the second region; removing the first work function layer from the first region; and depositing a fill material over the first region, the second region, the third region and the fourth region after the removing the first work function layer. In an embodiment the first work function layer comprises titanium nitride. In an embodiment the second work function layer comprises tungsten. In an embodiment the second work function layer comprises tungsten oxide. In an embodiment the second work function layer comprises tungsten nitride. In an embodiment the second work function layer comprises molybdenum. In an embodiment the second work function layer comprises molybdenum nitride.

In another embodiment, a method of manufacturing a semiconductor device includes: depositing a first plurality of gate materials over a first region and a second region; tuning a first threshold voltage of a first one of transistors formed from the first plurality of gate materials by removing a first gate material of the first plurality of gate materials from the first region; and tuning a second threshold voltage of a second one of transistors formed from the first plurality of gate materials by forming a second gate material over the first region and the second region and removing the second gate material from the second region, the first gate material being different from the second gate material, the first one of the transistors being a first PMOS transistor and the second one of the transistors being a second PMOS transistor. In an embodiment the depositing the second gate material over the first region comprises depositing the second gate material in physical contact with a barrier layer. In an embodiment the depositing the second gate material over the second region comprises depositing the second gate material in physical contact with the first gate material in the second region. In an embodiment the barrier layer comprises tantalum nitride. In an embodiment the depositing the first plurality of gate materials further includes: depositing an interfacial layer over a semiconductor fin; and depositing a dielectric capping layer over the interfacial layer. In an embodiment the method further includes depositing a glue layer over the second gate material. In an embodiment the method further includes depositing a fill material over the glue layer.

In yet another embodiment, a semiconductor device includes: a first gate stack over a first semiconductor fin, the first gate stack comprising a first metal material; a second gate stack over a second semiconductor fin, the second gate stack comprising the first metal material and a first p-metal material different from the first metal material; a third gate stack over a third semiconductor fin, the third gate stack comprising the first metal material and a second p-metal material different from the first metal material; a fourth gate stack over a fourth semiconductor fin, the fourth gate stack comprising the first metal material, the first p-metal material, and the second p-metal material; and wherein each of the first gate stack, the second gate stack, the third gate stack, and the fourth gate stack comprises an n-metal material, the n-metal material in the first gate stack being in physical contact with the first metal material, the n-metal material in the second gate stack being in physical contact with the first p-metal material, the n-metal material in the third gate stack being in physical contact with the second p-metal material, and the n-metal material in the fourth gate stack being in physical contact with the second p-metal material. In an embodiment the second p-metal material comprises a tungsten based material. In an embodiment the second p-metal material comprises tungsten carbon nitride. In an embodiment the second p-metal material comprises a molybdenum based material. In an embodiment the second p-metal material comprises molybdenum nitride. In an embodiment the first p-metal material comprises titanium nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a gate dielectric over a first region, a second region, a third region, and a fourth region, wherein the gate dielectric within each of the first region, the second region, the third region, and the fourth region has a same first composition;
a first metal material in physical contact with the gate dielectric in each of the first region, the second region, the third region, and the fourth region, the first metal material being a single material throughout the first metal material;
a first work function layer in physical contact with the first metal material in each of the second region and the fourth region but not located anywhere over the first region and the third region;
a second work function layer in physical contact with the first metal material in the third region and in physical contact with the first work function layer in the fourth region, the second work function layer being a different material from the first work function layer but not over the first region and the second region, the different material having a higher work function and a larger etch selectivity than the first work function layer and comprising tungsten oxide; and
a fill material over the first region, the second region, the third region and the fourth region, wherein the second region and the third region each have a single p-metal layer and the fourth region has two p-metal layers.

2. The semiconductor device of claim 1, wherein the second work function layer comprises a tungsten based material and wherein the first metal material being a single second composition of zirconium.

3. The semiconductor device of claim 1, wherein the second work function layer comprises tungsten carbon nitride and wherein the gate dielectric within each of the first region, the second region, the third region, and the fourth region has the same first composition when the fill material is present.

4. The semiconductor device of claim 1, wherein the second work function layer comprises a molybdenum based material, wherein the semiconductor device further comprises:
a first n-metal material in physical contact with the first metal material in the first region along a first interface, the first interface extending from a first side of the first n-metal material to a second side of the first n-metal material opposite the first side of the first n-metal material, in physical contact with the first work function layer in the second region, in physical contact with the second work function layer in the third region, and in physical contact with the second work function layer in the fourth region, the first n-metal material being a single third composition of zirconium; and a glue material in physical contact with both the fill material and the first n-metal material in each of the first region, the second region, the third region, and the fourth region.

5. The semiconductor device of claim 4, wherein the second work function layer comprises molybdenum nitride.

6. The semiconductor device of claim 1, wherein the second work function layer comprises titanium nitride.

7. The semiconductor device of claim 1, wherein the first metal material comprises tantalum nitride.

8. A semiconductor device comprising:
an interfacial layer over a first region, a second region, a third region, and a fourth region;
a single composition of a first dielectric material in physical contact with the interfacial layer in each of the first region, the second region, the third region, and the fourth region;
a first metal material in physical contact with the first dielectric material in each of the first region and the second region, the first metal material being a single material throughout the first metal material;
a first p-metal work function layer in physical contact with the first metal material in each of the second region and the fourth region but not located over any of the first region;
a second p-metal work function layer in physical contact with the first metal material in the first region and in physical contact with the first p-metal work function layer in the second region, wherein the second p-metal work function layer does not extend over any portion of the third region or the fourth region, wherein the second p-metal work function layer has a higher work function and a larger etch selectivity from the first p-metal work function layer, the second p-metal work function layer being tungsten oxide;
a first n-metal work function layer in physical contact with the second p-metal work function layer in the first region, in physical contact with the second p-metal work function layer in the second region, and in physical contact with the first metal material in the third region, wherein the first n-metal work function layer in the fourth region is in physical contact with the first p-metal work function layer;
a glue layer over the first region and the second region; and
a conductive fill material over the first region and the second region, wherein each of the first region and the fourth region have a same number of p-metal layers and the second region has a larger number of p-metal layers than the first region and the fourth region.

9. The semiconductor device of claim 8, wherein the second p-metal work function layer comprises a tungsten based material, wherein the first metal material is a single composition of ruthenium.

10. The semiconductor device of claim 8, wherein the second p-metal work function layer comprises tungsten carbon nitride, wherein the first n-metal work function layer in the third region is in physical contact with the first metal material along an interface, the interface extending from a first side of the first n-metal work function layer to a second side of the first n-metal work function layer opposite the first side of the first n-metal work function layer, the first n-metal work function layer being a single composition of manganese throughout the first n-metal work function layer.

11. The semiconductor device of claim 8, wherein the second p-metal work function layer comprises a molybdenum based material.

12. The semiconductor device of claim 8, wherein the second p-metal work function layer comprises molybdenum nitride.

13. The semiconductor device of claim 8, wherein the second p-metal work function layer comprises titanium nitride.

14. The semiconductor device of claim 8, wherein the first metal material comprises tantalum nitride.

15. A semiconductor device comprising:
a first gate stack over a first semiconductor fin, the first gate stack comprising a first metal material and a first fill material, the first metal material being a single material throughout the first metal material, the first fill material having a first width of between about 10 Å and about 50 Å;
a second gate stack over a second semiconductor fin, the second gate stack comprising the first metal material in physical contact with a gate dielectric, a first p-metal material different from the first metal material in physical contact with the first metal material, a first n-metal work function layer in physical contact with the first p-metal material, and a second fill material, the second fill material having a second width less than the first width, the second width being between about 10 Å and about 40 Å;
a third gate stack over a third semiconductor fin, the third gate stack comprising the first metal material and a third fill material, the first metal material in physical contact with both the gate dielectric and a second p-metal material different from the first metal material, but not comprising the first p-metal material, wherein the gate dielectric has a single composition at each point of contact with the first metal material, the third fill material having the second width;
a fourth gate stack over a fourth semiconductor fin, the fourth gate stack comprising the first metal material, the first p-metal material in physical contact with the first metal material, the second p-metal material in physical contact with the first p-metal material, and a fourth fill material, wherein the first gate stack and the second gate stack are completely free from the second p-metal material and wherein the fourth fill material has a third width less than the second width, the third width being between about 10 Å and about 40 Å; and
wherein each of the first gate stack, the second gate stack, the third gate stack, and the fourth gate stack comprises an n-metal material, the n-metal material in the first gate stack being in physical contact with the first metal material, the n-metal material in the second gate stack being in physical contact with the first p-metal material, the n-metal material in the third gate stack being in physical contact with the second p-metal material, and the n-metal material in the fourth gate stack being in physical contact with the second p-metal material.

16. The semiconductor device of claim 15, wherein the second p-metal material comprises a tungsten based material, wherein the n-metal material in the first gate stack is in physical contact with the first metal material along a first interface, the first interface extending from a first side of the n-metal material to a second side of the n-metal material opposite the first side of the n-metal material.

17. The semiconductor device of claim 16, wherein the second p-metal material comprises tungsten carbon nitride, wherein the n-metal material is a single composition of tantalum carbon nitride throughout the n-metal material.

18. The semiconductor device of claim 15, wherein the second p-metal material comprises a molybdenum based material.

19. The semiconductor device of claim 18, wherein the second p-metal material comprises molybdenum nitride.

20. The semiconductor device of claim 15, wherein the first p-metal material comprises titanium nitride.

* * * * *